(12) United States Patent
Tsuduki et al.

(10) Patent No.: US 8,698,938 B2
(45) Date of Patent: Apr. 15, 2014

(54) SOLID-STATE IMAGING APPARATUS, METHOD OF MANUFACTURING SAME, AND CAMERA

(75) Inventors: Koji Tsuduki, Kawasaki (JP); Takanori Suzuki, Tokyo (JP); Hisatane Komori, Ayase (JP); Satoru Hamasaki, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 169 days.

(21) Appl. No.: 13/360,166

(22) Filed: Jan. 27, 2012

(65) Prior Publication Data
US 2012/0212637 A1 Aug. 23, 2012

(30) Foreign Application Priority Data
Feb. 17, 2011 (JP) ................................. 2011-032628

(51) Int. Cl.
*H04N 5/225* (2006.01)
*H04N 5/335* (2011.01)
*H01L 27/146* (2006.01)

(52) U.S. Cl.
USPC ............................ 348/340; 348/294; 257/432

(58) Field of Classification Search
USPC ........................... 348/340, 294–308, 373, 374
See application file for complete search history.

(56) References Cited

U.S. PATENT DOCUMENTS

| | | | |
|---|---|---|---|
| 4,751,559 A | 6/1988 | Sugawa et al. | 357/30 |
| 4,847,668 A | 7/1989 | Sugawa et al. | 357/30 |
| 5,309,013 A | 5/1994 | Suzuki et al. | 257/446 |
| 8,279,336 B2 | 10/2012 | Tsuduki et al. | |
| 2005/0104982 A1 | 5/2005 | Shimazu et al. | |
| 2007/0200053 A1 | 8/2007 | Nomura et al. | |
| 2008/0237768 A1* | 10/2008 | Yajima et al. | 257/434 |
| 2010/0309354 A1* | 12/2010 | Tsuduki et al. | 348/294 |

FOREIGN PATENT DOCUMENTS

| | | |
|---|---|---|
| CN | 101924115 A | 12/2012 |
| EP | 0630056 A1 | 12/1994 |
| JP | 2003-92394 A | 3/2003 |
| JP | 2003-309272 A | 10/2003 |
| JP | 2005-136144 A | 5/2005 |
| JP | 2007-208045 A | 8/2007 |

OTHER PUBLICATIONS

Jan. 28, 2014 Chinese Office Action for corresponding Chinese Patent Application No. 201210034099.8.

* cited by examiner

*Primary Examiner* — Tuan Ho
*Assistant Examiner* — Selam Gebriel
(74) *Attorney, Agent, or Firm* — Fitzpatrick, Cella, Harper & Scinto

(57) ABSTRACT

A solid-state imaging apparatus, comprising: a semiconductor chip having a principal face including a pixel region; a protruding portion disposed on the principal face to surround the pixel region; a cover member disposed over the pixel region; and an adhesive material surrounding the pixel region and bonding the cover member and the protruding portion, is provided. The protruding portion has top and first side faces facing the space, a first edge line being formed by this two faces. The adhesive material bonds the top face of the protruding portion and the cover member. The adhesive material has a first face facing the interior space, and the first face extends from the first edge line toward the cover member. Perimeters of the interior space, in planes parallel to the principal face become shorter in a direction from the top face of the protruding portion toward the cover member.

11 Claims, 7 Drawing Sheets

SOLID-STATE IMAGING APPARATUS, METHOD OF MANUFACTURING SAME, AND CAMERA

BACKGROUND OF THE INVENTION

1. Field of the Invention

The present invention relates to a solid-state imaging apparatus, a method of manufacturing the same, and a camera.

2. Description of the Related Art

Recently, there is a significant need for slimmer and smaller solid-state imaging apparatuses with the downsizing and slimming of digital cameras and mobile phones. Therefore, Japanese Patent Laid-Open No. 2005-136144 proposes a solid-state imaging apparatus in which a light transmitting cover member is directly fixed on a solid-state imaging element chip, and a pixel region is hermetically sealed. A liquid adhesive material that is inexpensive and easy to handle is used for the fixation of the solid-state imaging element chip and the cover member. When the cover member and the solid-state imaging element chip are directly bonded with the liquid adhesive material, the adhesive material is wet and spreads on a surface of the solid-state imaging element chip. Therefore, it is necessary that the adhesive material coats the position separate by some distance from the pixel region so that the adhesive material does not flow into the pixel region of the solid-state imaging element chip, which increases the size of the solid-state imaging apparatus. In Japanese Patent Laid-Open No. 2003-92394, a periphery of a pixel region is surrounded by a ridge and thereby the intrusion of adhesive resin that bonds a CCD chip and a seal cover, into the pixel region is suppressed. Thereby, the downsizing of a solid-state imaging apparatus is achieved.

SUMMARY OF THE INVENTION

An aspect of the present invention provides a solid-state imaging apparatus, comprising: a semiconductor chip having a principal face including a pixel region; a protruding portion disposed on the principal face of the semiconductor chip so as to surround the pixel region; a light transmitting cover member disposed over the pixel region; and an adhesive material surrounding the pixel region so that an interior space is formed between the semiconductor chip and the cover member, and bonding the cover member and the protruding portion, wherein the protruding portion has a top face and a first side face facing the space, a first edge line being formed by the top face and the first side face, the adhesive material bonds the top face of the protruding portion and the cover member, the adhesive material has a first face facing the interior space, and the first face extends from the first edge line toward the cover member, and perimeters of the interior space, in planes parallel to the principal face become shorter in a direction from the top face of the protruding portion toward the cover member.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

In the solid-state imaging apparatus described in Japanese Patent Laid-Open No. 2003-92394, since the adhesive resin is located outside the ridge, the downsizing of the solid-state imaging apparatus is not sufficiently realized. In addition, as described below, depending on the shape of the adhesive material, since the unnecessary light reflected from the adhesive material reaches the pixel region, the image quality obtained in the solid-state imaging apparatus is degraded. Therefore, an aspect of the present invention provides a technique for reducing the size of a solid-state imaging apparatus while the unnecessary light that reaches a pixel region of the solid-state imaging apparatus is reduced.

Figure 1A:
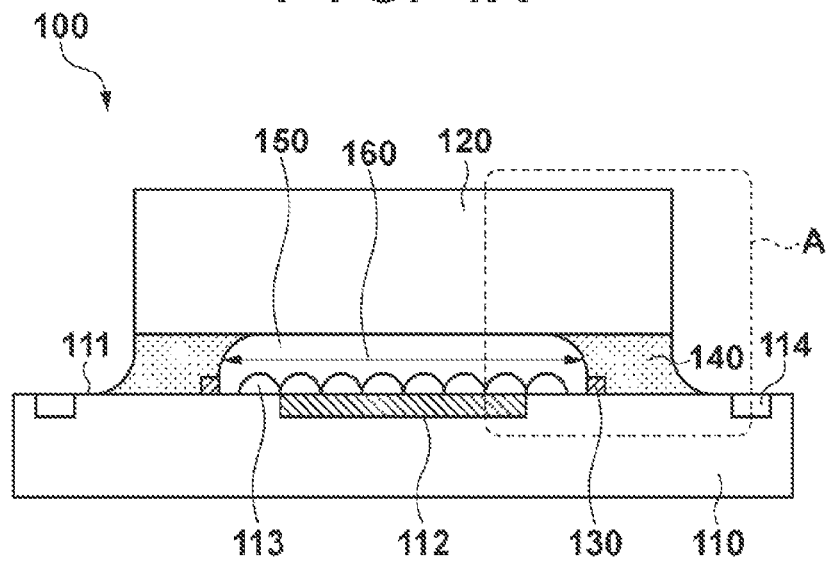
FIGS. 1A and 1B are diagrams illustrating a configuration example of a solid-state imaging apparatus 100 according to an embodiment of the present invention.
Figure 1B:
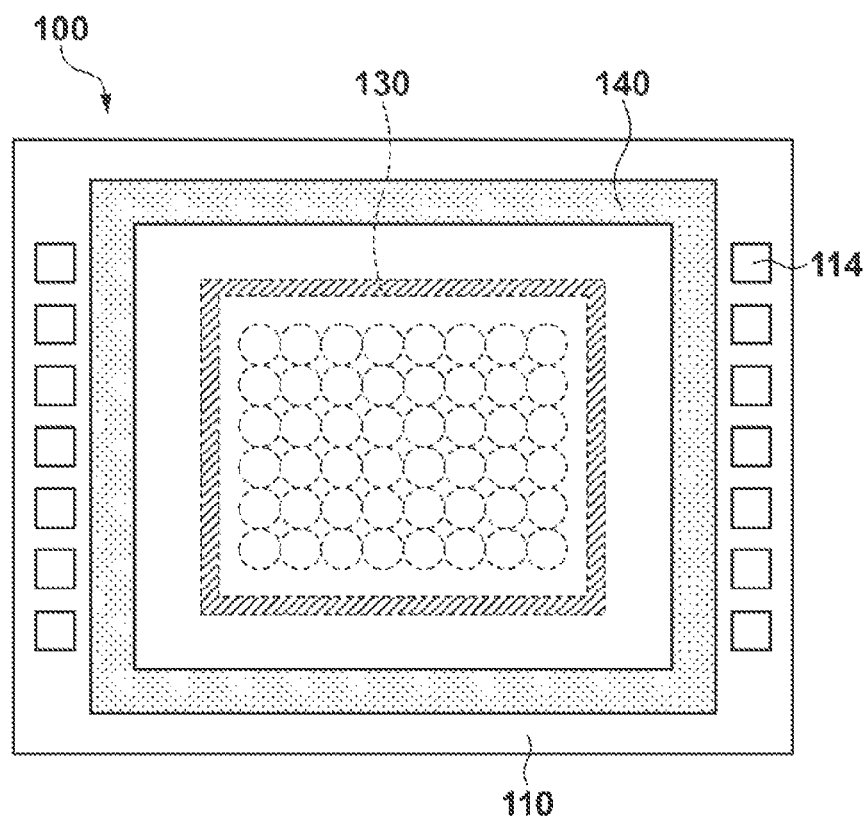
Figure 2:
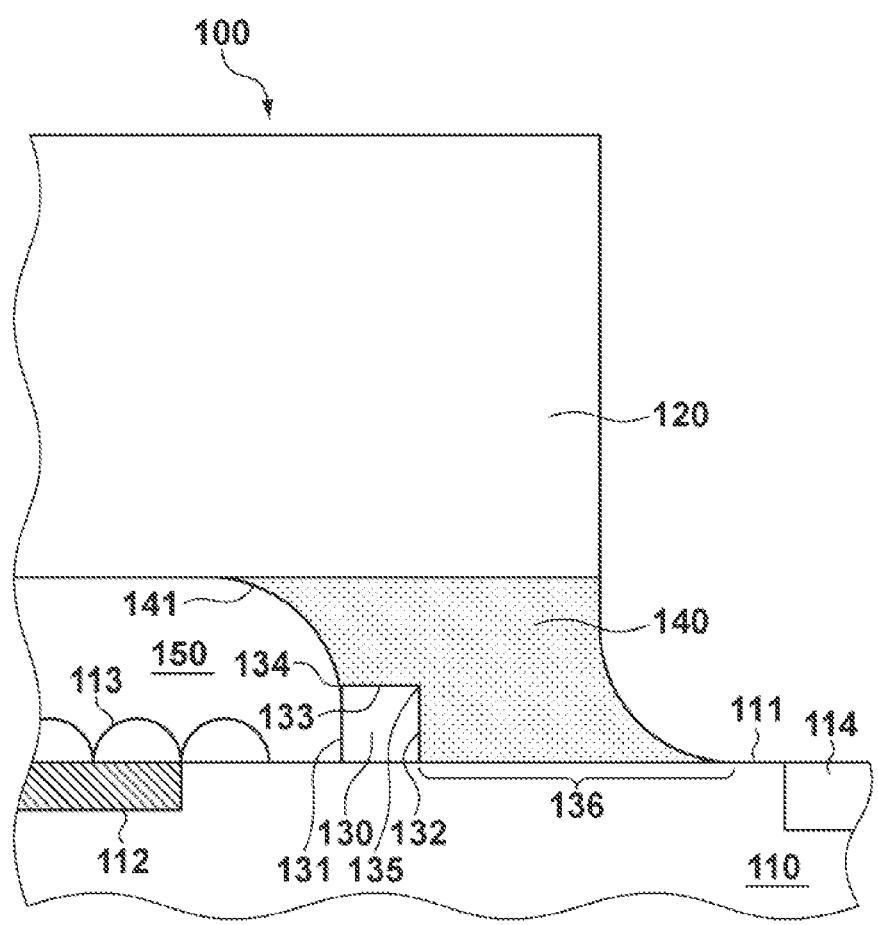
FIG. 2 is a diagram illustrating the configuration example of the solid-state imaging apparatus 100 according to the embodiment of the present invention.

Embodiments of the invention will now be described with reference to the accompanying drawings. To begin with, a configuration example of a solid-state imaging apparatus 100 according to one embodiment will be described referring to FIGS. 1A through 2. FIG. 1A is a cross-sectional view of the solid-state imaging apparatus 100, and FIG. 1B is a plan view of the solid-state imaging apparatus 100. FIG. 2 is an enlarged view of the dotted boxed region A in FIG. 1A. According to the embodiment as shown in FIGS. 1A and 1B, the solid-state imaging apparatus 100 can include a semiconductor chip 110, a cover member 120, a protruding portion 130, and an adhesive material 140.

The semiconductor chip 110 has a principal face 111, and the principal face 111 includes, in a part thereof, a pixel region 112. A plurality of light-receiving elements (not shown) that constitute pixels are formed in the pixel region 112. The semiconductor chip 110 can be, for example, a CCD image sensor and a CMOS sensor having a photoelectric conversion element as light-receiving element. The semiconductor chip 110 can further include a micro-lens 113 and a terminal 114 for external connection on the principal face 111. The micro-lens 113 is disposed at the position at which the pixel region 112 is covered, and condenses, into each pixel, the incident light into the solid-state imaging apparatus 100. The terminal 114 is used to output, to the outside, a signal from the light-receiving element, or to input a signal from the outside. The semiconductor chip 110 may further include a color filter (not shown) and a planarizing film (not shown) disposed on the color filter, between the pixel region 112 and the micro-lens 113.

The cover member 120 transmits light, is above the semiconductor chip 110, and is disposed at the position at which the pixel region 112 is covered. Glass, resin, crystal, or the like, for example, can be used as material for the cover member 120. The cover member 120 may have an anti-reflective coating or an IR coating on a surface thereof (surface on the side opposite to the semiconductor chip 110) or the back face (surface on the semiconductor chip 110 side). Thereby, the optical properties of the cover member 120 can improve.

The protruding portion 130 is disposed on the principal face 111 of the semiconductor chip 110 to protrude from the semiconductor chip 110. The protruding portion 130 is fixed to the semiconductor chip 110. In FIG. 1B, the micro-lens 113 and the protruding portion 130 visible through the cover member 120 are shown in dotted lines for reference. As shown in FIG. 1B, the protruding portion 130 is disposed on the principal face 111 of the semiconductor chip 110 to surround the pixel region 112. The protruding portion 130 is disposed in contact with the principal face 111. Photosensitive resin, for example, can be used as material for the protruding portion 130. As shown in FIG. 2, the protruding portion 130 has a side face 131 (first side face) located close to the pixel region 112, a side face 132 (second side face) located away from the pixel region 112, and a top face 133. In this embodiment, the side face 131 is on the side opposite to the side face 132. An edge line 134 (first edge line) is formed by the side face 131 and the top face 133. An edge line 135 (second edge line) is formed by the side face 132 and the top face 133. Hereinafter, "a subject (for example, a pixel region) may be surrounded by an object (for example, adhesive material)" means that the subject is surrounded by an open-loop object (that is, an object having one or more slits) or a closed-loop object (that is, an object having no slits).

The adhesive material 140 bonds the cover member 120 and the semiconductor chip 110. Specifically, the adhesive material 140 adheres to the cover member 120, and in addition, adheres to the top face 133 and the side face 132 of the protruding portion 130, and a region 136 around the side face 132 that is a part of the principal face 111 of the semiconductor chip 110. As shown in FIG. 1B, the adhesive material 140 also surrounds the pixel region 112, and the adhesive material bonds circumferentially the cover member 120 and the protruding portion 130. By circumferentially bounding them, an airtight (hermetic) interior space 150 can be formed between the semiconductor chip 110 and the cover member 120. The interior space 150 can be defined as the space surrounded by the semiconductor chip 110, the cover member 120, the protruding portion 130, and the adhesive material 140. According to the solid-state imaging apparatus 100 of the present embodiment, the side face 131 of the protruding portion 130 faces the interior space 150. The side face 131 of the protruding portion 130 also faces the interior space 150. On the other hand, the side face 132 and the top face 133 of the protruding portion 130 do not face the interior space 150, and are covered by the adhesive material 140.

A face that faces the interior space 150, of the adhesive material 140 is referred to as a face 141 (first face). The face 141 extends from the edge line 134 of the protruding portion 130 to the cover member 120. The face 141 of the adhesive material 140 is wet and is spread, narrowing the interior space 150 from the edge line 134 toward the cover member 120. As a result, the perimeters of the interior space 150, in planes parallel to the principal face 111 become shorter in a direction from the edge line 134, i.e., the top face of the protruding portion, toward the cover member 120. An arrow 160 of FIG. 1A indicates the state in which the width of the interior space 150 is viewed in the direction parallel to the principal face 111.

Figure 3:
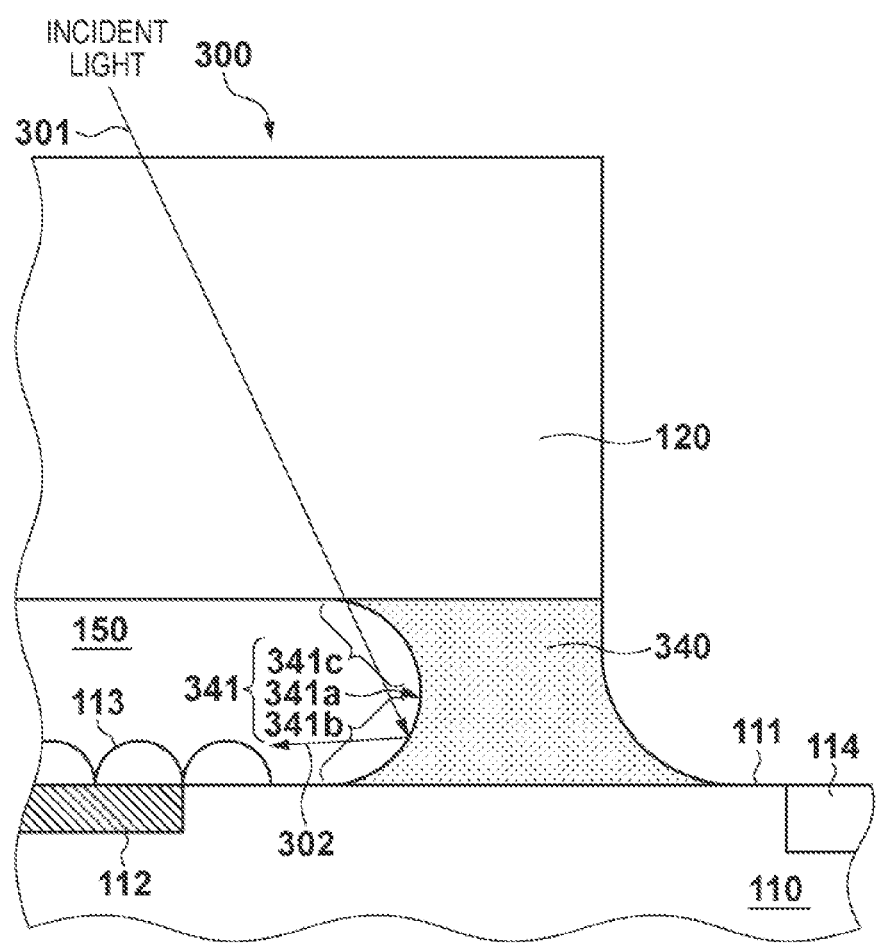
FIG. 3 is a diagram illustrating a configuration of a solid-state imaging apparatus 300 of a comparative example.

Subsequently, advantages of the solid-state imaging apparatus 100 described in FIGS. 1A and 1B will be described by comparing the advantages with that of a comparative example described in FIG. 3. FIG. 3 is an enlarged view of a part corresponding to FIG. 2, of a solid-state imaging apparatus 300 as the comparative example. The common components between the solid-state imaging apparatus 100 and the solid-state imaging apparatus 300 are marked with identical reference numerals, and the duplicate description is omitted. In the solid-state imaging apparatus 300, a protruding portion is not disposed on the semiconductor chip 110, and the semiconductor chip 110 and the cover member 120 are bonded with an adhesive material 340.

A face that faces the interior space 150, of the adhesive material 340 is referred to as a face 341. The face 341 has a most contracted part 341a near the center point between the semiconductor chip 110 and the cover member 120. The face 341 further has a region 341b extending from the part 341a to the semiconductor chip 110, and a region 341c extending from the part 341a to the cover member 120. Due to the wettability of the adhesive material 340, the part 341b and the part 341c both are wet and are spread narrowing the interior space 150. As a result, the region 341b has a first arc shape, and the part 341c has a second arc shape. The first arc shape has an arc shape of a convex in the semiconductor chip 110 direction or an upper-chord arc shape. The second arc shape has an arc shape of a convex in the cover member 120 direction or a lower-chord arc shape.

In FIG. 3, as shown by an arrow 301, a part of the incident light into the solid-state imaging apparatus 300 passes through the cover member 120 to reach the region 341b of the adhesive material 340. The light that reaches the region 341b is reflected from the face 341, and the reflected light is directed toward the pixel region 112 as shown by an arrow 302. In this manner, the reflected light that reaches the pixel region 112 degrades the image quality obtained in the solid-state imaging apparatus 300. If the adhesive material 340 is disposed away from the pixel region 112, although the amount of light reflected toward the pixel region 112 can be reduced, the size of the solid-state imaging apparatus becomes large. In addition, even if the adhesive material 340 is disposed away from the pixel region 112, since the pixel region 341b has the first arc shape, some reflected light can reach the pixel region 112.

On the other hand, as shown in FIG. 2, the face 141 of the adhesive material 140 of the solid-state imaging apparatus 100 has the second arc shape, and does not include a region having the first arc shape. Therefore, in the solid-state imaging apparatus 100, as compared with the solid-state imaging apparatus 300, the amount of light reflected from the adhesive material 140 toward the pixel region 112 can be reduced. Here, since the side face 131 of the protruding portion 130 is perpendicular to the principal face 111 of the semiconductor chip 110, the amount of light reflected from the side face 131 of the protruding portion 130 and directed toward the pixel region 112 becomes smaller than that of light reflected from the region 341b of the solid-state imaging apparatus 300. As a result, in the solid-state imaging apparatus 100, as compared with the solid-state imaging apparatus 300, the image quality can be enhanced. In addition, in the solid-state imaging apparatus 100, as compared with the solid-state imaging apparatus 300, since the adhesive material 140 can be disposed near the pixel region 112, it is possible to reduce the size of the solid-state imaging apparatus 100.

Figure 4A:
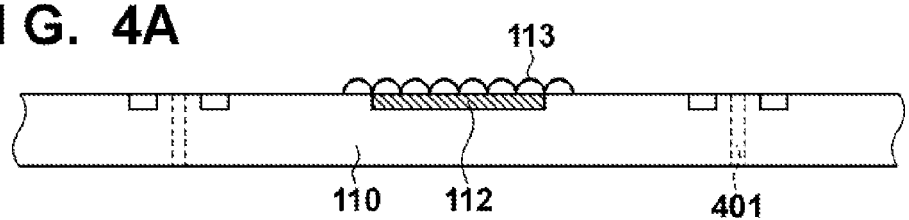
FIGS. 4A through 4E are diagrams illustrating an example of a method of manufacturing the solid-state imaging apparatus 100 according to the embodiment of the present invention.

Subsequently, with reference to FIGS. 4A through 4E, an example of a method of manufacturing the solid-state imaging apparatus 100 will be described. To begin with, as shown in FIG. 4A, the semiconductor chip 110 having the pixel region 112, in which a plurality of light-receiving elements are formed, is prepared. In FIG. 4A, a plurality of semiconductor chips 110 are coupled, and are divided into the divisions of the individual semiconductor chips 110 by dicing lines 401. For example, a plurality of semiconductor chips 110 are formed on a semiconductor wafer and separated by cutting the semiconductor wafer.

Figure 4B:
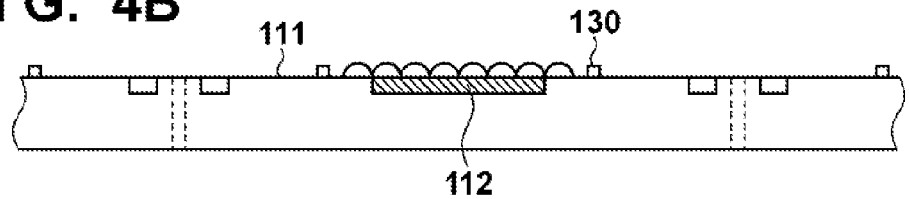

Next, as shown in FIG. 4B, the protruding portion 130 is formed on the principal face 111 of the semiconductor chip 110 so as to surround the pixel region 112. The protruding portion 130 can be formed by performing exposure patterning, after the principal face 111 of the semiconductor chip 110 is coated with photosensitive resin by spin coating, or the like. Alternatively, the protruding portion 130 may be formed by bonding, on the principal face 111, a photosensitive sheet formed in a sheet shape in advance, and performing exposure patterning. As described with reference to FIGS. 1A and 1B, the protruding portion 130 surrounds circumferentially the pixel region 112. By performing exposure patterning to form the protruding portion 130, the edge line 134 can be formed in which the side face 131 and the top face 133 of the protruding portion 130 are perpendicular to each other.

Figure 4C:
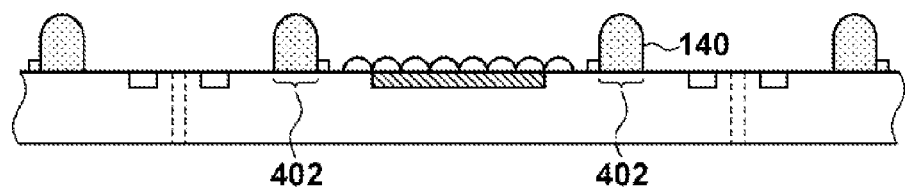

Next, as shown in FIG. 4C, a region 402, outside the protruding portion 130 (on the side opposite to the pixel region 112) of the principal face 111 of the semiconductor chip 110, is coated with the adhesive material 140. Both of a part of the top face 133 of the protruding portion 130 and the region 402 may be coated with the adhesive material 140. As described with reference to FIGS. 1A and 1B, the adhesive material 140 coats the protruding portion 130 so as to circumferentially surround the protruding portion 130. However, the adhesive material 140 may coat only one part, and there may be a part that is not coated. The adhesive material 140 may be disposed so as to circumferentially surround the protruding portion 130 as a result of the adhesive material 140 being spread after the cover member 120 is attached. In order to prevent intrusion into the pixel region 112, the inside of the protruding portion 130 (the pixel region 112 side) is not coated with the adhesive material 140.

It is possible for the adhesive material 140 to be applied by a well-known dispenser and printing method. As material for the adhesive material 140, it is possible to use a thermoset resin or a light curable resin that has fluidity in an uncured state. Particularly, by using a light curable resin superior in fast curing property, it is possible to suppress the fluidity of the adhesive material 140. In addition, as material for the adhesive material 140, by using a light curable resin, it is possible to reduce the amount of work. In addition, in order to obtain, at high yield, a function of preventing resin from spreading which shall be described below, it is possible to use a resin with reduced fluidity as material for the adhesive material 140. For example, it is possible to use a resin not less than 10000 mPa·s in viscosity as material for the adhesive material 140. Such a viscosity is realized by causing polymerization of the resin so as to increase the mean molar mass of the resin. In addition, when the adhesive material 140 includes an inorganic filler such as an oxide filler or a metal filler, the inorganic filler can precipitate on the face 141 of the adhesive material 140. In this case, light is scattered by the inorganic filler, and unnecessary scattered light can enter the pixel region 112. Therefore, the adhesive material 140 is formed by an organic filler including epoxy resin, acrylic resin, silicone resin, or the like, and may be free of the inorganic filler such as the oxide filler or the metal filler.

Figure 4D:
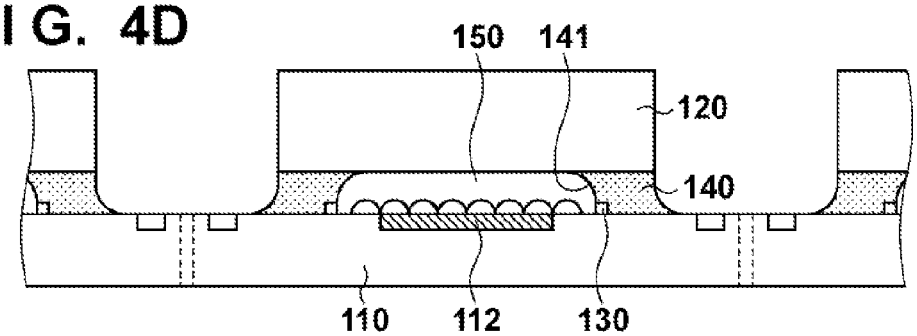

Next, as shown in FIG. 4D, the cover member 120 is attached to the semiconductor chip 110. To begin with, the cover member 120 is disposed at the position at which the pixel region 112 is covered. Thereafter, by bringing the cover member 120 close to the semiconductor chip 110, the adhesive material 140 is pressed by the cover member 120. Thereby, the interior space 150 surrounded by the semiconductor chip 110, the cover member 120, the protruding portion 130, and the adhesive material 140 is formed. The adhesive material 140 pressed by the cover member 120 is deformed into the shape as shown in FIG. 4D. Specifically, the adhesive material 140 with which the region 402 of the semiconductor chip 110 is coated spreads on the top face 133 of the protruding portion 130. The adhesive material 140 spread on the top face 133 of the protruding portion 130 is stopped by the edge line 134. That is, the protruding portion 130 plays a role in preventing the adhesive material 140 from spreading so that the adhesive material 140 does not pass into the pixel region 112. In addition, the adhesive material 140 is wet and spreads towards the interior space 150, on the cover member 120, and as a result, the face 141 of the adhesive material 140 has the second arc shape.

Figure 4E:
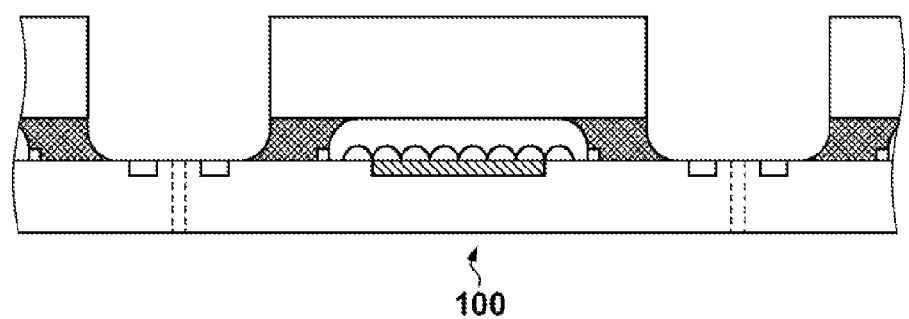

Next, as shown in FIG. 4E, the adhesive material 140 is cured with heat, light, or the like and thereby the cover member 120 is fixed to the semiconductor chip 110. Finally, by cutting the dicing lines 401, the individual solid-state imaging apparatuses 100 are obtained.

Subsequently, with reference to FIGS. 5A through 5D, a modified example of the protruding portion 130 will be described. FIG. 5A again shows the protruding portion 130 of the solid-state imaging apparatus 100 as described with reference to FIGS. 1A through 2. The side face 131 is perpendicular to the principal face 111 of the semiconductor chip 110, and the top face 133 is perpendicular to the side face 131.

Figure 5A:
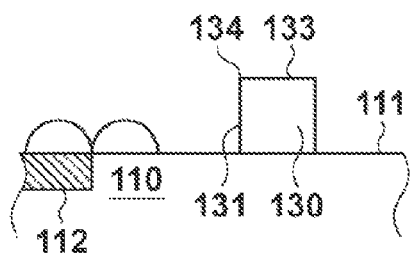
FIGS. 5A through 5D are diagrams illustrating a modified example of the solid-state imaging apparatus 100 according to the embodiment of the present invention.
Figure 5B:
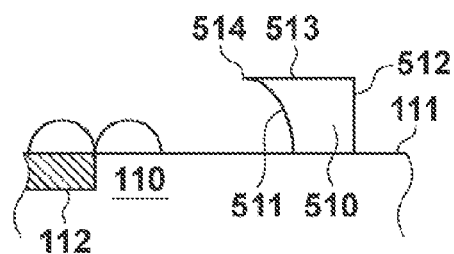

A protruding portion 510 as shown in FIG. 5B has a side face 511 located close to the pixel region 112, a side face 512 located away from the pixel region 112, and a top face 513. An edge line 514 is formed by the side face 511 and the top face 513. The side face 511, in a manner similar to the face 141 of the adhesive material 140 as described with reference to FIG. 2, has the second (convex in the cover member 120 direction) arc shape. Thereby, the circumferences of the interior space 150, in planes parallel to the principal face 111 become shorter in a direction from the semiconductor chip 110 toward the cover member 120. The protruding portion 510 has the side face 511 of such a shape, and thereby the reflected light that is reflected from the protruding portion 510 and reaches the pixel region 112 is further reduced. In addition, since the edge line 514 of the protruding portion 510 is sharper than the edge line 134 of the protruding portion 130, the performance of the function of preventing the adhesive material 140 from spreading is enhanced.

Figure 5C:
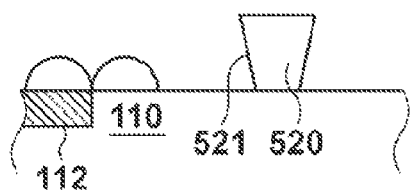
Figure 5D:
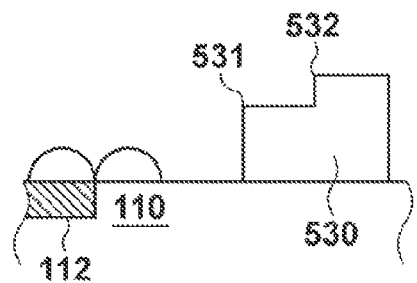

Although the side face 511 of the protruding portion 510 is a curved surface, the side face may be a flat surface as in a side face 521 of a protruding portion 520 as shown in FIG. 5C. The protruding portion 520 also has advantages similar to the protruding portion 510. In addition, the top face may have a step as in a protruding portion 530 as shown in FIG. 5D. In the protruding portion 530, the spread of the adhesive material 140 may be stopped by an edge line 532, and furthermore may be stopped by an edge line 531.

Figure 6:
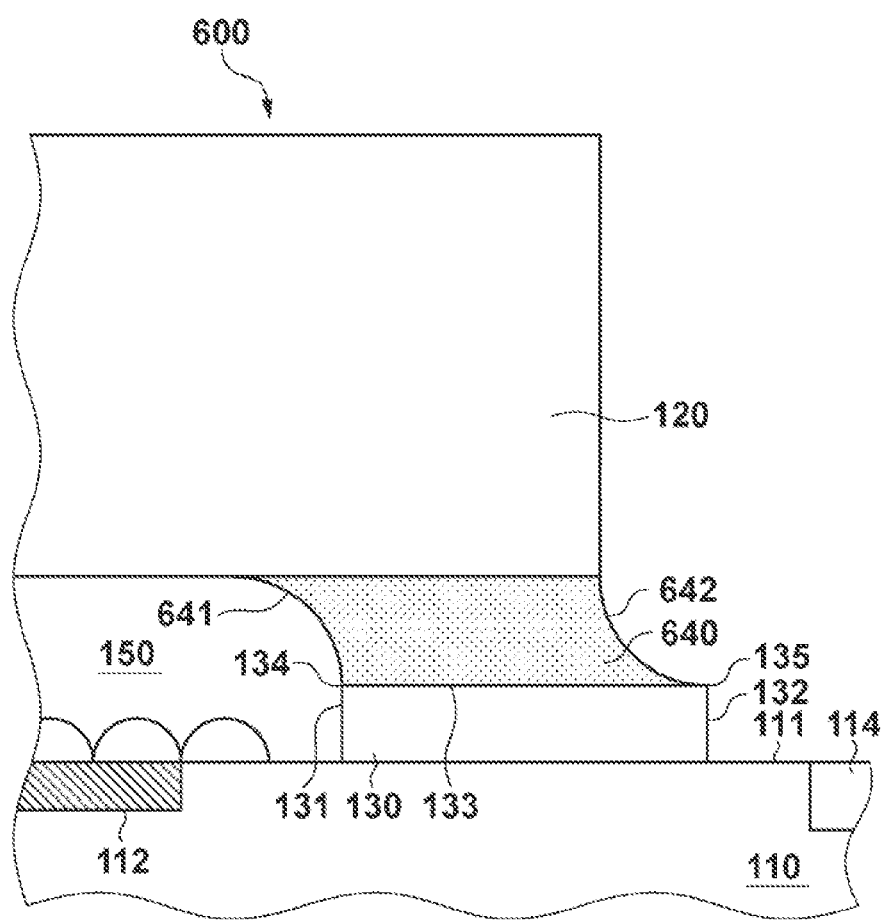
FIG. 6 is a diagram illustrating a configuration example of a solid-state imaging apparatus 600 according to an embodiment of the present invention.

Subsequently, with reference to FIG. 6, an illustrative configuration of a solid-state imaging apparatus 600 according to another embodiment of the present invention will be described. FIG. 6 is an enlarged view of a part corresponding to FIG. 2, of the solid-state imaging apparatus 600. The common components between the solid-state imaging apparatus 100 and the solid-state imaging apparatus 600 are marked with identical reference numerals, and the duplicate description is omitted. In addition, the modified example of the solid-state imaging apparatus 100 as described with reference to FIGS. 5A through 5D is equally applicable to the solid-state imaging apparatus 600.

An adhesive material 640 of the solid-state imaging apparatus 600, although adhering to the top face 133 of the protruding portion 130, does not adhere to the side face 132, and the principal face 111 of the semiconductor chip 110. The adhesive material 640 has a face 641 (first face) that faces the interior space 150, and a face 642 (second face) that does not face the interior space 150. In this embodiment, the face 641 is on the side opposite to the face 642. Since the face 641 is similar to the face 141 of the solid-state imaging apparatus 100, description thereof is omitted. The face 642 extends from the edge line 135 of the protruding portion to the cover member 120.

Although the solid-state imaging apparatus 600 can be manufactured in a manner similar to the solid-state imaging apparatus 100 as described with reference to FIGS. 4A through 4E, only the top face 133 of the protruding portion 130 is coated with the adhesive material 640 in the process as described with reference to FIG. 4C. Although the adhesive material 640 is pressed by the cover member 120 so as to be spread on the top face 133, the edge line 135 suppresses the adhesive material 640 from being wet and spreading to the side face 132. Therefore, it is possible to avoid the adhesive material 640 from being wet and spreading to the terminal 114. Therefore, as compared with the solid-state imaging apparatus 100, in the solid-state imaging apparatus 600, it is possible to shorten the distance between the terminal 114 and the protruding portion 130, and further downsizing of the solid-state imaging apparatus 600 is realized. The width of the protruding portion 130, i.e., the distance between the side face 131 and the side face 132 is appropriately set so that the top face 133 can be coated with the adhesive material 640. The width of the protruding portion 130 of the solid-state imaging apparatus 600 can be wider than the width of the protruding portion 130 of the solid-state imaging apparatus 100.

Figure 7:
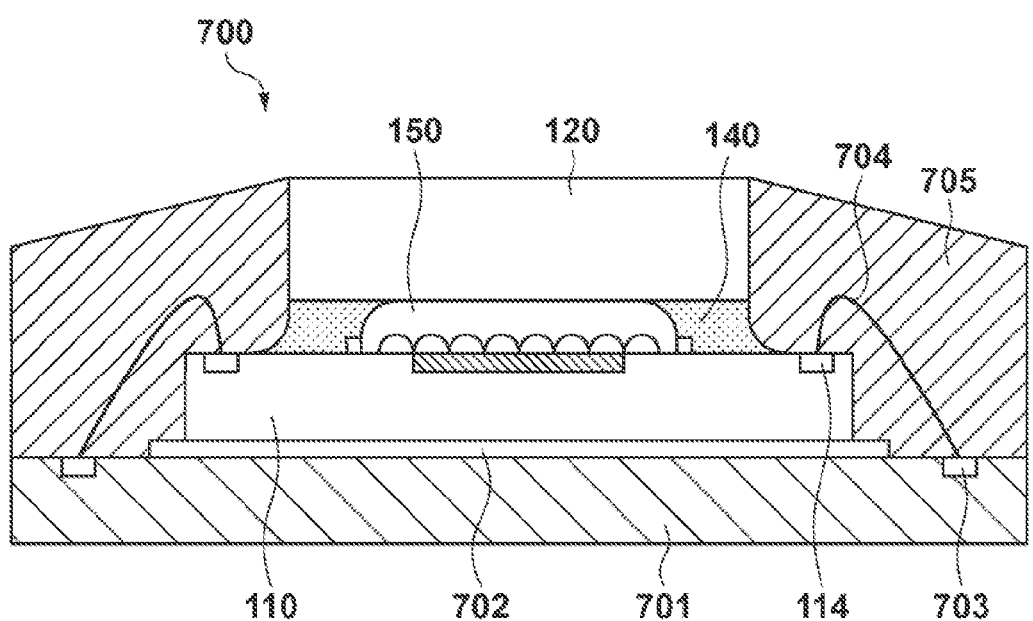
FIG. 7 is a diagram illustrating a configuration example of a package 700 according to an embodiment of the present invention.

Subsequently, with reference to FIG. 7, an illustrative configuration of a solid-state imaging apparatus package 700 will be described. In FIG. 7, although an example in which the solid-state imaging apparatus 100 is packaged is treated, any of the solid-state imaging apparatuses of embodiments as described above may be packaged in the same way.

The solid-state imaging apparatus package 700 can include a substrate 701 including a lead frame, a printed wiring board, a flexible wiring board, a metal base wiring board, and the like. The substrate 701 has a terminal 703 on the face on which the solid-state imaging apparatus 100 is mounted. The back face of the semiconductor chip 110 (face on the side opposite to the principal face 111) is fixed to the substrate 701 by a fixing member 702. The terminal 114 of the semiconductor chip 110 and a terminal 703 of the substrate are connected by an electrically conductive member 704 such as metal wire or the like. A signal from the terminal 114 is transmitted to the terminal 703 by the electrically conductive member 704.

The solid-state imaging apparatus package 700 further includes a sealing member 705 that seals the face of the substrate 701 on which the solid-state imaging apparatus 100 is mounted, the electrically conductive member 704, the semiconductor chip 110, the adhesive material 140, and the side face of the cover member 120. The sealing member 705 may be formed by epoxy resin or the like, and may be colored black for absorption of light. Although not shown in FIG. 7, the sealing member 705 seals circumferentially the side face of the solid-state imaging apparatus 100. Thereby, the boundary between the adhesive material 140 and the cover member 120, and the boundary between the adhesive material 140 and the semiconductor chip 110 are circumferentially sealed by the sealing member 705. Then the airtightness of the interior space 150 is enhanced. In addition, the side face of the cover member 120 is circumferentially sealed, and the light incident from the side face of the cover member 120 into the solid-state imaging apparatus 100 is reduced.

According to the solid-state imaging apparatuses of the various embodiments described above, since any unnecessary light that reaches the pixel region is reduced, the image quality obtained in the solid-state imaging apparatus is enhanced. At the same time, the downsizing of the solid-state imaging apparatus is realized.

As an application example of the solid-state imaging apparatuses according to the various embodiments described above, a camera into which this solid-state imaging apparatus is incorporated will now be illustratively described. The concept of the camera includes not only an apparatus that is primarily intended for shooting, but also an apparatus having a complementarily shooting function (for example, a personal computer, a mobile terminal, or the like). The camera includes the solid-state imaging apparatus according to the present invention, illustrated as the embodiment as described above, and a signal processing unit for processing a signal output from this solid-state imaging apparatus. This signal processing unit can include, for example, an A/D converter, and a processor for processing digital data output from this A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-032628, filed Feb. 17, 2011, which is hereby incorporated by reference herein in its entirety.

What is claimed is:
1. A solid-state imaging apparatus, comprising:
a semiconductor chip having a principal face including a pixel region;
a protruding portion disposed on the principal face of the semiconductor chip so as to surround the pixel region;
a light transmitting cover member disposed over the pixel region; and
an adhesive material surrounding the pixel region so that an interior space is formed between the semiconductor chip and the cover member, and bonding the cover member and the protruding portion, wherein
the protruding portion has a top face and a first side face facing the space, a first edge line being formed by the top face and the first side face,
the adhesive material bonds the top face of the protruding portion and the cover member,
the adhesive material has a first face facing the interior space, and the first face extends from the first edge line toward the cover member, and
perimeters of the interior space, in planes parallel to the principal face become shorter in a direction from the top face of the protruding portion toward the cover member.

2. The apparatus according to claim 1, wherein the first side face of the protruding portion is perpendicular to the semiconductor chip.

3. The apparatus according to claim 1, wherein the perimeters of the interior space, in the planes parallel to the principal face become shorter in a direction from the semiconductor chip toward the cover member.

4. The apparatus according to claim 1, wherein the protruding portion further has a second side face that does not face the interior space, a second edge line being formed by the top face and the second side face, and
the adhesive material further has a second face that does not face the interior space, the second face extending from the second edge line toward the cover member.

5. The apparatus according to claim 1, wherein the protruding portion further has a second side face that does not face the interior space, and
the adhesive material further bonds the second side face of the protruding portion, a part around the second side face of the protruding portion, of the principal face of the semiconductor chip, and the cover member.

6. The apparatus according to claim 1, wherein the adhesive material is a light curable resin.

7. The apparatus according to claim 1, wherein the protruding portion contacts the principal face of the semiconductor chip.

8. A method of manufacturing a solid-state imaging apparatus, comprising:
preparing a semiconductor chip having a principal face including a pixel region;
forming a protruding portion on the principal face of the semiconductor chip so as to surround the pixel region; and
disposing a light transmitting cover member at a position at which the pixel region is covered, and bonding circumferentially the cover member and the protruding portion with an adhesive material so that an interior space is formed between the semiconductor chip and the cover member, wherein
the protruding portion has a top face and a first side face facing the space, a first edge line being formed by the top face and the first side face,
the adhesive material bonds the top face of the protruding portion and the cover member,
the adhesive material has a first face facing the interior space, the first face extending from the first edge line toward the cover member, and
perimeters of the interior space, in planes parallel to the principal face become shorter in a direction from the first edge line toward the cover member.

9. The method according to claim 8, wherein the protruding portion is formed by a patterning photosensitive resin.

10. The method according to claim 8, wherein the protruding portion is formed so as to contact the principal face.

11. A camera comprising:
the solid-state imaging apparatus according to claim 1; and
a signal processing unit that processes a signal obtained by the solid-state imaging apparatus.

* * * * *